United States Patent [19]

DiGiacomo et al.

[11] Patent Number: 5,367,195
[45] Date of Patent: Nov. 22, 1994

[54] STRUCTURE AND METHOD FOR A SUPERBARRIER TO PREVENT DIFFUSION BETWEEN A NOBLE AND A NON-NOBLE METAL

[75] Inventors: Giulio DiGiacomo, Hopewell Junction, N.Y.; Jung-Ihl Kim, Seoul, Rep. of Korea; Chandrasekhar Narayan, Hopewell Junction; Sampath Purushothaman, Yorktown Heights, both of N.Y.

[73] Assignee: International Business Machines Corporation, Armonk, N.Y.

[21] Appl. No.: 1,524

[22] Filed: Jan. 8, 1993

[51] Int. Cl.$^5$ ............... H01L 23/48; H01L 29/46; H01L 29/62; H01L 29/64
[52] U.S. Cl. ................. 257/767; 257/763; 257/781
[58] Field of Search ............ 257/763, 764, 780, 781, 257/784, 779, 767, 765, 766, 762, 761, 771, 769

[56] References Cited

U.S. PATENT DOCUMENTS

| | | | |
|---|---|---|---|
| 27,934 | 3/1874 | Merrin | 317/101 |
| 1,658,713 | 2/1928 | Fuller | |
| 2,847,331 | 8/1958 | Ashley | 117/220 |
| 3,060,557 | 10/1962 | Rostoker | 29/194 |
| 3,226,822 | 1/1966 | Budde | 29/473.1 |
| 3,458,925 | 8/1969 | Napier et al. | 257/781 |
| 3,633,076 | 1/1972 | Nurnberg | 317/234 R |
| 3,893,160 | 7/1975 | Botzenhardt | 257/763 |
| 4,017,890 | 4/1977 | Howard | 357/67 |
| 4,074,342 | 2/1978 | Honn et al. | 257/747 |
| 4,105,828 | 8/1978 | Borchert | 428/665 |
| 4,176,443 | 12/1979 | Iannuzzi et al. | 257/763 |
| 4,463,059 | 7/1984 | Bhattacharya | 428/620 |
| 4,464,441 | 8/1984 | Pikorz | 428/579 |
| 4,772,523 | 9/1988 | Mace | 428/630 |
| 4,880,684 | 11/1989 | Boss | 428/209 |
| 4,970,570 | 11/1990 | Agarwala | 357/68 |
| 4,985,310 | 1/1991 | Agarwala | 428/620 |
| 5,175,609 | 12/1992 | DiGiacomo et al. | 257/781 |

FOREIGN PATENT DOCUMENTS 3-44933  2/1991  Japan .................. 257/780

OTHER PUBLICATIONS

Research Disclosure, Jul. 1986, No. 26726 (N. Hamilton) Backside Preparation and Metallization of Silicon Wafers U.S. patent Application. Ser. No. 968,930, filed Oct. 30; 1992, "Interconnect Structure Having Improved Metallization".

Primary Examiner—Andrew J. James
Assistant Examiner—S. V. Clark
Attorney, Agent, or Firm—Aziz M. Ahsan

[57] ABSTRACT

This invention relates generally to structure and method for preventing metal diffusion between a noble metal layer and an adjoining non-noble metal layer, and more specifically to new structures and methods for providing a superbarrier structure between copper and an adjoining noble metal layer. This is achieved by sequentially deposited a layer of non-noble metal, a layer of titanium, a layer of molybdenum, and a layer of noble or relatively less noble metal as the interconnecting metallurgy. This invention also relates to an improved multilayer metallurgical pad or metallurgical structure for mating at least a portion of a pin or a connector or a wire to a substrate.

19 Claims, 2 Drawing Sheets

STRUCTURE AND METHOD FOR A SUPERBARRIER TO PREVENT DIFFUSION BETWEEN A NOBLE AND A NON-NOBLE METAL

FIELD OF THE INVENTION

This invention relates generally to structure and method for preventing metal diffusion between a noble metal layer and an adjoining non-noble metal layer, and more specifically to new structures and methods for providing a superbarrier structure between copper and an adjoining noble metal layer. This is achieved by sequentially depositing on the layer of non-noble metal, a layer of titanium, a layer of molybdenum, and a layer of noble or relatively less noble metal as the interconnecting metallurgy. This invention also relates to an improved multilayer metallurgical pad or metallurgical structure for mating at least a portion of a pin or a connector or a wire to a substrate.

BACKGROUND OF THE INVENTION

On one of the surfaces of a semiconductor component, such as a chip, there is an arrangement of pads, each with a solder ball (hereinafter referred to as C-4 solder ball pads or just C-4s) which are adapted to provide connection between the chip and a substrate, such as a ceramic substrate. This is done by means of bonding of the solder balls which are heated to a temperature above the melting temperature of the solder balls thereby permitting solder bonding of the solder balls to pads carried on the mating surface of the substrate. Connected between the solder pad areas and other sites on or in the substrate are so-called fan-out lines which extend along the mating surface of the substrate beneath a layer of insulation. At certain locations on the surface of the substrate, it is necessary to make pads available for engineering change (EC) wiring to be connected to the fan-out metallurgy. The engineering change wiring, however, is usually connected to the pads by the process of wire bonding, either by ultrasonic vibration or by thermo-compression techniques, or by solder bonding. The metallurgical requirements for solder bonding as contrasted with the requirements for wire bonding techniques differ.

Bi-metallic layers have been used for different purposes, for example, Ashley (U.S. Pat. No. 2,847,331) discloses a hydrogen isotope target disc consisting of a backing of molybdenum or tungsten having a coating of titanium on the backing.

Similarly, Rostoker et al. (U.S. Pat. No. 3,060,557) disclosed a method in which intermediate metals are interposed between a base metal and a cladding metal, such interposed material acts as a diffusion barrier to eliminate the formation of brittle and continuous intermetallic compounds between the base and the cladding metal.

Nurnberg et al. (U.S. Pat. No. 3,633,076) disclosed a method of applying a metallic contact strip to a semiconductor, where the contact strip consisted of three sequential layers of different metals stacked upon each other. The lowest or inner layer is supposed to possess a high affinity towards oxygen, while the middle layer is preferably selected from molybdenum, tungsten, vanadium and chromium, and the outer layer is a noble metal.

In Bhattacharya et al. (U.S. Pat. 4,463,059) the metallurgical requirements for solder bonding and wire bonding were discussed in the context of the top surface metallurgy of a ceramic substrate. Several metallurgical structures were proposed. For solder bonding, one proposed structure consisted of fan-out lines of chromium and gold, then a barrier layer of cobalt or chromium over the gold followed by a top layer of nickel or copper. For wire bonding, the nickel or copper top layer was eliminated. In other structures, Bhattacharya et al. suggested the use of gold where solder bonding was to occur.

Merrin et al. (U.S. Pat. Re. No. 27,934) discussed the requirements of ball limiting metallurgy (BLM), i.e., the pads on the bottom of the chip which serve to limit the flow of the solder balls upon heating. The particular ball limiting metallurgy proposed by Merrin et al. comprises sequential layers of chromium, copper and then gold.

Similarly, Research Disclosure 26726, Number 267, (July 1986), discloses a backside preparation and metallization of silicon wafers for die-bonding comprising coating the backside of a semiconductor chip with sequential layers of chromium or titanium, nickel or copper followed by a top layer of gold, and which is followed by a coating of tin.

Mace et al. (U.S. Pat. No. 4,772,523) discloses a composite metallization structure on a glass substrate consisting of Cr/Au/Ni/Au/solder layers for a silicon capacitive pressure sensor. The interior gold layer does not bond strongly to chromium because of a lack of mutual solubility, but it appears that the interior gold layer will diffuse into the grain boundaries of the nickel and chrome metallization layer during the anodic bonding process. This anodic bonding process is done prior to the solder application, and the composite metallization layers are subjected to anodic-bonding temperatures under an electric potential to diffuse gold into nickel and chromium.

In Agarwala et al. (U.S. Pat. No. 4,985,310) a cobalt layer is disclosed as a diffusion barrier between a noble metal (Au, Pt, Pd, Sn) and a less noble metal (Cu, Ti, Cr) for use in soldering and wire bonding pads in electronic components.

The present day top surface metallurgy for ceramic substrates may comprise a multilayered metallurgical structure of chromium or titanium, copper and then gold or, alternatively, molybdenum, nickel and then gold. The currently favored ball limiting metallurgy comprises chromium, copper and gold. Both the top surface metallurgy (hereinafter TSM) and the ball limiting metallurgy (hereinafter BLM) undergo many solder reflow operations during the process of joining the chips to the ceramic substrate. The gold in the TSM and BLM quickly dissolves in the solder, leaving the underlying copper (or nickel) to react with the solder which is usually of a lead/tin composition. The solder and the underlying copper (or nickel) have been chosen because they form a good solder joint.

The reaction of the copper and the solder, however, causes the formation of copper/tin intermetallics. Ordinarily, this would not be a problem but due to the multiple solder reflows necessary to join the chips to the ceramic substrate, the copper/tin intermetallics, eventually build up to the point where they spall off the underlying metallization, resulting in the loss of BLM conduction as well as the loss of a reaction barrier between the solder and the underlying chip metallization. Further, the spalling of these intermetallics can lead to early failure of the solder joint.

Although cobalt serves well as a reaction barrier to solder it does not limit the outward diffusion of copper to the top surface of noble metals in oxidizing gas ambient commonly encountered in component assembly processes and service environments of electronic assemblies. This out diffusion renders the noble metal surface unbondable by wires and leads to high contact resistances in pad-on-pad contact structures.

PURPOSES AND SUMMARY OF THE INVENTION

It is a purpose of the invention to have an improved joint between electronic components which is not as susceptible to excessive formation of intermetallics and their accompanying problems.

It is another purpose of the invention to have an improved joint between electronic components comprising a metallurgical structure which has a reduced rate of reaction with solder and braze alloys.

It is yet another purpose of the invention to have an improved joint between electronic components after multiple solder reflows.

Still another purpose of this invention is to provide an interconnecting metallurgy which provides:

(a) low enough stresses, that the substrate does not crack,
(b) is sufficiently noble, so that corrosion in field environment does not cause intolerable fails,
(c) adheres to the substrate, such that, it will not separate under the process and field stresses, and
(d) be wettable by braze and solder, and must react with them to form a strong metallurgical bond by solid solution and/or intermetallics formation.

According to one aspect of the invention there is disclosed a multilayered interconnecting metallurgical structure for an electronic component comprising, a structure over a substrate, wherein said structure comprises sequentially formed layers of at least one adhesion layer, at least one non-noble metal layer, a titanium layer, a molybdenum layer and at least one noble or relatively less noble metal layer.

According to another aspect of the invention, there is disclosed a method for forming a multilayered interconnecting metallurgical structure for an electronic component comprising the steps of:

a) depositing at least one electrically conductive adhesion layer directly on said electronic component,
b) depositing at least one non-noble metal layer directly on said at least one electrically conductive adhesion layer,
c) depositing a layer of titanium on said layer of non-noble metal layer,
d) depositing a layer of molybdenum directly on said layer of titanium, and
e) depositing at least one layer of noble or relatively less noble metal directly on said layer of titanium, thereby forming said multilayered interconnecting metallurgical structure.

These and other purposes and aspects of the invention will become more apparent after referring to the following description considered in conjunction with the accompanying drawings.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
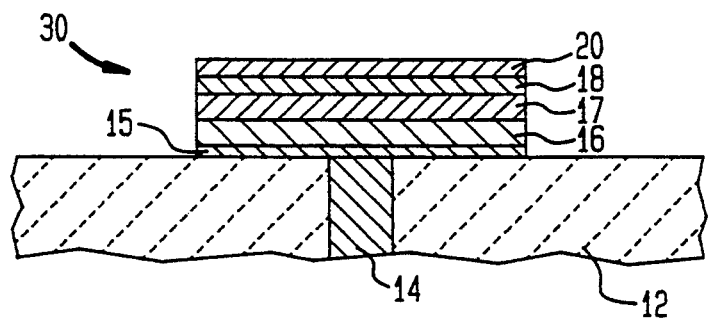
FIG. 1 is a cross-sectional view of a multilayered metallurgical structure according to one aspect of the invention.
Figure 2:
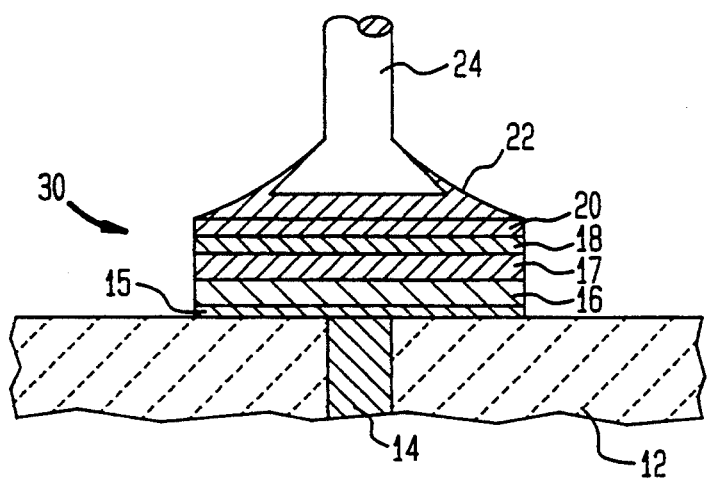
FIG. 2 shows a pin connected to the multilayered metallurgical structure of FIG. 1.

Preferred embodiments of the present invention are depicted in FIGS. 1-5, in which like numerals refer to like features of the invention. Such features are not necessarily shown to scale in the drawings.

In film connectors and edge connectors, which rely on pressure contact, the oxidation at the contact is of utmost importance because it increases the electric resistance and can cause electric failures. To combat oxidation the contact films at the surface are made of a noble metal, such as gold. However, underlying base metals, i.e., copper, nickel, cobalt, etc., can diffuse into the noble metal surface and oxidize during the thermal cycling, such as during polymer curing cycle, chip joining, pin brazing and also under field conditions during the lifetime of the part or module. Therefore, the diffusion barriers of this invention are needed to prevent the diffusion of such undesired elements in the gold or noble metal surface.

It has been discovered that a Mo/Ti bi-metallic barrier layer between a noble or relatively less noble metal and a non-noble metal prevents diffusion of atoms from the non-noble metal layer to the noble metal layer and also from the bi-metallic barrier layer itself. For the ease of discussion both the noble and relatively less noble metals will be referred to as noble metals.

The use of either Mo (molybdenum) or Ti (titanium) alone has shown not to work. Because, Mo is not a good barrier to the non-noble metal, but it will not diffuse into the noble metal. While, Ti is a good barrier to the non-noble metal, but it will itself diffuse into the noble metal. However, it has been discovered that both in combination do not diffuse either themselves into the noble metal or allow any other metal on the opposite side to diffuse into the noble or relatively less noble metal.

This is accomplished by insuring that Mo layer always contacts the noble or relatively less noble metal layer, and that titanium layer always contacts the non-noble metal layer. This arrangement has worked extremely well for noble or relatively less noble metals, such as, Ag, Au, Pd, Pt, etc., and non-noble metals, such as, aluminum, copper, etc., and especially in an annealing atmosphere encountered in electronic applications.

The main purpose of this bi-metallic diffusion barrier layer is to prevent the non-noble underlayer from diffusing into the noble or relatively less noble metal layer, and then oxidize the noble or relative less noble metal layer and degrade the contact resistance of the noble metal layer.

Noble metals provide very low contact resistance but they are very expensive, therefore, a non-noble metal layer in combination with the noble metal layer is used in applications where otherwise only noble metals would be desired.

The bi-metallic barrier layer of Ti/Mo between the non-noble metal layer and the noble metal layer according to this invention reduces the stress, almost eliminates corrosion, provides a very good TCE (Thermal Coefficient of Expansion), and there is no pull-strength degradation. This invention can be used with any type of single or multilayer substrates, for example, the substrates could be selected from a group comprising, ceramic substrates, silicon substrates, glass-ceramic substrates, alumina substrates, aluminum nitride substrates, silicon nitride substrates, mullite substrates, etc.

Any surface mountable item, such as pins, flexible connector, pad-on-pad connector can also be successfully connected to this new metallurgy.

Figure 5:
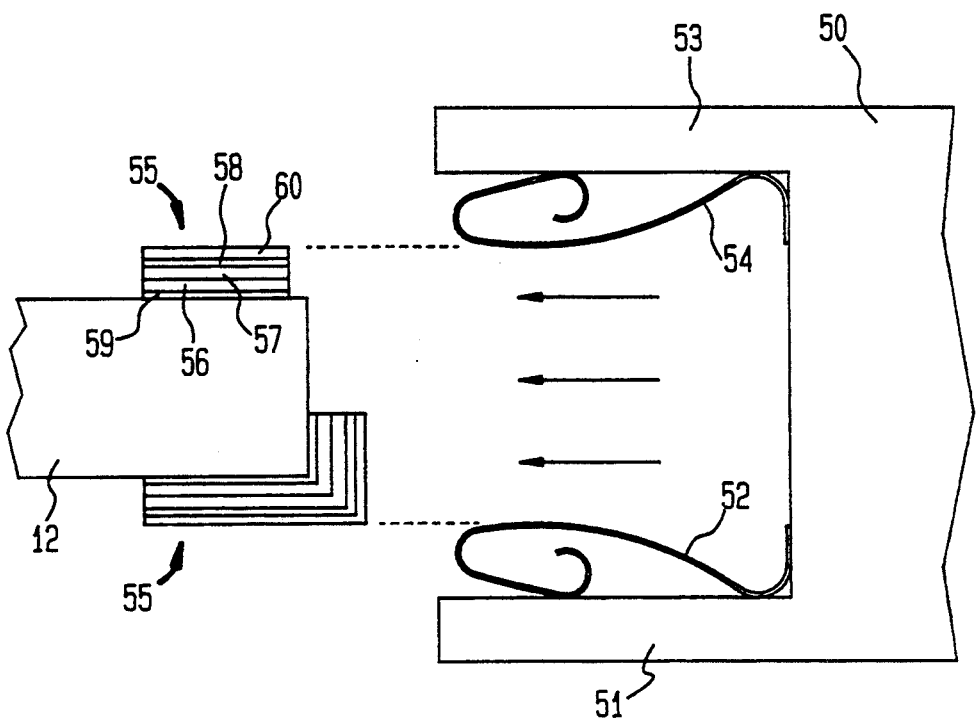
FIG. 5 is yet another embodiment of the invention where an edge connector is secured to a substrate having multilayered metallurgical edge connection.

This new metallurgy can also be used for edge connector applications as illustrated in FIG. 5.

Referring to the Figures in more detail and particularly referring to FIG. 1, there is shown a multilayered metallurgical structure or pad, generally indicated by 30, for an electronic component, 12. The electronic component 12, can be a silicon device, such as a semiconductor chip, or a substrate, such as a ceramic substrate. For the ease of understanding this invention the electronic component 12, will hereinafter be referred to as substrate 12. The substrate or electronic component 12, has at least one via connection 14. On one of the surfaces of the substrate 12, can be a layer of wiring metallurgy (not shown). By way of illustration and not limitation, the wiring metallurgy may be an aluminum/-copper alloy, aluminum, copper, gold, or any suitable electrically conductive material. The multilayer metallurgical structure 30, can be a ball limiting metallurgy (BLM), pin braze pad, C4 pad, wire bond pad, etc.

FIG. 1, shows the basic metal film structure deposited on the substrate 12. The layers or films are deposited sequentially within a vacuum system (without breaking the vacuum) by chemical vapor deposition, etching, evaporation, sputtering, or by any other suitable technique. An electrically conductive adhesion layer 15, is first deposited directly on the substrate 12, so that it is electrically in contact with at least a portion of at least one via connection 14. In some cases the adhesion layer 15, may have to contact two or more via connections 14. This is followed by a layer of non-noble metal 16, and a layer of titanium 17, deposited directly on the layer of non-noble metal 16. Next a layer of molybdenum 18, is deposited over the layer of titanium 17, and, finally, a layer of noble or relatively less noble metal layer 20, is deposited on the molybdenum layer 18. These deposited layers are then typically formed into an array of pads. These pads can now be used to connect various components such as wires, pins, connectors etc.

Within the substrate 12, there are one or more via connections 14, for communicating between the wiring in the various layers (not shown) of the substrate 12, and other electronic components that may be joined to the substrate 12.

The particular application will determine the variation and/or the thickness of the metallurgy that is most suitable and economical for forming the multilayered metallurgical structure 30, such as a pad.

It should be understood that noble or relatively less noble metal, and hereinafter referred to as noble metal, means those metals and alloys that have a reduced tendency to oxidize in air. Included within this definition are true noble metals such as gold, platinum, palladium and alloys thereof, and also other metals having a reduced tendency to oxidize in air such as tin. The noble or relatively less noble metal is selected from the group consisting of gold, palladium, platinum, rhodium, silver, tin and mixtures thereof. The use of the term noble metal shall hereinafter encompass noble as well as relatively less noble metals.

A non-noble metal is defined as a metal which has a tendency to oxidize in air. The non-noble metal layer is selected from a group comprising aluminum, cobalt, copper, nickel, to name a few, and mixtures thereof.

The electrically conductive adhesion layer is selected from a group comprising chromium, molybdenum, tantalum, titanium, tungsten, zirconium, vanadium, hafnium, to name a few, and mixtures thereof.

It is preferred that the noble or relatively less noble metal layer 20, be gold, but alternatively could also be platinum, palladium, rhodium or tin. Similarly, it is preferred that the non-noble metal layer 16, is copper, but alternatively could also be aluminum, cobalt, nickel, to name a few, and mixtures thereof.

It is further preferred that the adhesion layer 15, has a thickness from about 0.02 to about 0.10 micron, and preferably between about 0.02 to about 0.03 micron, the non-noble metal layer 16, has a thickness from about 1.00 to about 8.00 micron, and preferably between about 2.0 to about 6.0 micron, the titanium layer 17, has a thickness from about 0.20 to about 2.00 micron, and preferably between about 0.50 to about 1.50 micron, the molybdenum layer 18, has a thickness from about 0.20 to about 2.00 micron, and preferably between about 0.50 to about 1.50 micron, and the noble or relatively less noble metal layer 20, has a thickness from about 0.5 to about 5.00 micron, and preferably between about 1.00 to about 5.00 micron.

The non-noble metal layer 16, is there to provide electrical distribution over the substrate 12. The bi-metallic layer of titanium 17, and molybdenum 18, is there as a superbarrier between the noble metal layer 20, and the non-noble metal layer 16. This combination of layers provide high resistance to corrosion and chemical compatibility and solubility with the other metals, which is a key requirement for most applications. The noble metal layer 20, such as gold, is to protect the surface and preserve the wettability of the braze/solder, and to make possible wire bonding by ultrasonics, pressure bonding, microwelding, etc., and also to provide intimate contact for the pad-on-pad and edge connectors.

The multilayered metallurgical pad 30, that is formed may serve the purpose of a pad for joining with a pin 24, using solder or braze 22, as shown in FIG. At least a portion of the noble or relatively less noble metal layer is in contact with a solder material. The structure shown in FIG. 2, may be formed in a number of ways, but one particular way is to first deposit a layer of insulating material (not shown), for example, a polyimide, over the substrate 12, as described in Boss et al., U.S. Pat. No. 4,880,684, the disclosure of which is incorporated herein by reference. By photolithography, or etching or laser ablation the polyimide is removed in the area over via 14, fully exposing the metallurgy of the via Thereafter, the multilayer metallurgical structure or pad 30, is deposited as discussed earlier. The multilayered metallurgy that is deposited over the at least one via 14, is similar to the structure shown in FIG. 1. After the deposition of the adhesion layer 15, over at least one via a non-noble metal layer 16, such as copper, is deposited on the adhesion layer 15, followed by a layer of titanium 17, and a layer of molybdenum 18, and finally a layer of noble or relatively less noble metal 20, preferably gold, which is deposited directly on the layer of molybdenum 18. The pin 24, is then secured to the solder or braze 22, as disclosed by methods well known in the art, such as U.S. Pat. No. 4,970,570 (Agarwala, et al), the disclosure of which is incorporated herein by reference.

If a solder ball (not shown) is used to secure to the solder 22, instead of the pin 24, then the multilayer metallurgical structure 30, and substrate 12, are heated to cause the solder 22, to melt and flow as taught by the Merrin et al, U.S. Pat. Re. No. 27,934.

In practice if the multilayer metallurgical structure or pad 30, was to come in contact with solder, the noble metal layer 20, would dissolve into the solder during the reflow operation. Accordingly, the noble metal layer 20, would be fugitive. On the other hand, if the multilayer metallurgical structure 30, was only to undergo wire bonding, where soldering was not to occur, then noble metal layer 20, would remain substantially in place.

An unexpected advantage of the noble metal layer 20, is that the noble metal forms a thin layer of intermetallic that is adherent with the braze or solder 22, and the underlying molybdenum layer 18. During reflow and rework operations, this intermetallic remains wettable by the solder so that fluxing is not required.

During the reflow operation, the noble metal layer 20, becomes absorbed within the solder 22, and thus is considered to be a fugitive layer. The importance of the noble metal layer resides in the fact that it prevents the underlying molybdenum layer from oxidizing during storage, and therefore allowing it to wet and react with the solder.

Alternatively, the multilayer metallurgical pad may serve the purpose of a wire bonding site for an engineering change pad in which case the TSM may not come in contact with solder. For example, wire bonding may be done by ultrasonic vibration or thermo-compression, in which case, solder is not used.

Figure 3:
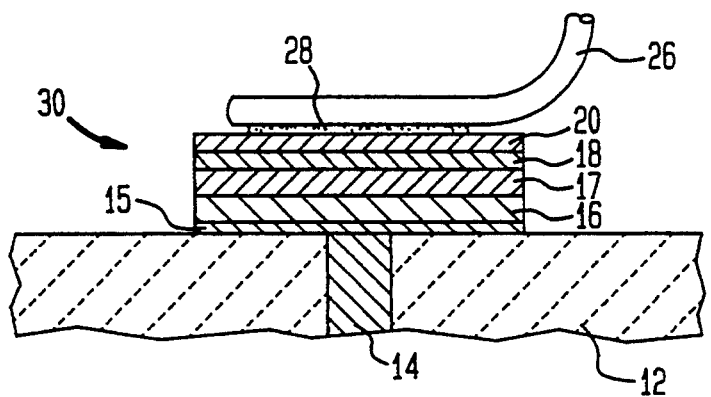
FIG. 3 shows a wire connected to the multilayered metallurgical structure of FIG. 1.

An example of the application of the pad as a wire-bonding site is shown in FIG. 3. Here at least a portion of the wire 26, is attached to at least a portion of the pad structure 30, (shown in FIG. 1) by the bonding technique which is most suitable for the application, such as ultrasonics, pressure bonding, microweld, etc. This bonding will result in a diffusion zone 28.

The thickness of the noble metal layer 20, such as gold, will vary depending on the bonding technique employed, i.e., for ultrasonic bonding, thick gold would be required. Because of the wire 26, larger thermal expansion coefficient relative to the substrate 12, high shear stresses are induced to the metals and metal/substrate interface and outer boundaries. Again, especially for microwelding, non-noble metal layer provide both the adhesion and stress reduction, gold the bonding capacity, and molybdenum and titanium the reaction control.

As illustrated so far, the multilayer metallurgical structure of this invention has the required properties of low stress, minimal corrosion, strong adhesion to the substrate (ceramics, polymers, etc.) and reactability with brazes and solders in a wide range of applications. Each layer is there for a specific purpose.

There may be applications in which the substrate is very brittle and susceptible to cracking, in which case the multilayer metallurgical structure may be too stressful if deposited directly on the substrate. In such a case, a polymeric film, i.e. polyimide, can be deposited directly on the substrate and a portion of this polymeric film is ablated to provide an electrical contact between the via and the overlaying metallurgy. This polymeric film on the substrate acts as a cushion to absorb most of the film and/or braze induced stress, preventing their transmission to the substrate.

The structure of this invention can be on a base metallurgy, (not shown) wherein the base metallurgy is between the adhesion layer 15, and the non-noble metal layer 16, and, wherein the material for the base metallurgy is selected from the group consisting of aluminum, chromium, cobalt, copper, hafnium, molybdenum nickel, niobium, tantalum, titanium, zirconium, noble metals and mixtures thereof.

Figure 4:
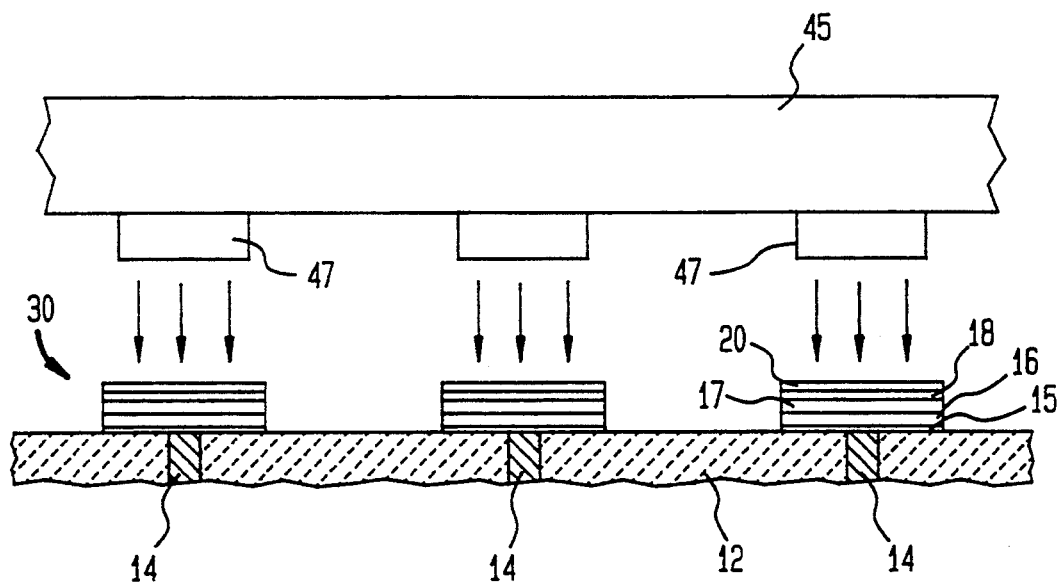
FIG. 4 is another embodiment of the invention where a connector having metal pads is being secured to a substrate which has the multilayered metallurgical structure of this invention.

Another application of this invention is illustrated in FIG. 4, which is an example of pad-on-pad connector. A rigid or flexible connector 45, having metal pads 47, is made to contact the substrate 12, having structure 30, such as a pad 30. In most situations the metal pads 47, have a corresponding structure 30, such as a pad 30, and vice versa. No metallurgical bond between the two pad surfaces is formed, i.e., between pads 47, and pad 30. The electrical contact between the pads 30 and 47, is maintained under adequate pressure, achieved through the flexibility of the connector or individual pads. The pad surfaces that come in physical contact must be noble so that oxidation does not occur, which would eventually produce high unacceptable electric contact-resistance. The connectors can be pad-on-pad, edge connectors or other types, all requiring mechanical and corrosion stability provided by the disclosed metallurgy. The mechanical aspect can be severe because connectors are often flat flexible cables constructed of polymeric and metallic layered composite structures (e.g., Kapton/Cu), which have relatively high thermal expansion coefficients compared to the ceramic substrates and which induce high shear stresses to the connecting pads.

An example of using the multilayered metallurgical interconnection of this invention as an edge connector is illustrated in FIG. 5. By methods well known in the art the substrate 12, has edge pads 55, formed on the edges of the substrate 12. The edge pad 55, could have the multilayered metallurgy of pad 30.

In FIG. 5, the multilayered metallurgy of pad 30, is shown, where the edge pad 55, is comprised of sequentially deposited layers of at least one adhesion layer 59, at least one non-noble metal layer 56, a titanium layer 57, a molybdenum layer 58, and at least one layer of noble metal 60. Preferably, the non-noble metal layer 56, is copper, and the noble metal layer 60, is gold. An edge connector 50, having extensions 51 and 53, to accommodate springs 52 and 54, receives the edge of the substrate 12, so that at least a portion of the pad 55, makes an electrical connection with at least a portion of the edge connector 50.

The BLM metallurgy of this invention has shown extremely good results. The BLM that is currently used in some cases has been shown to be highly susceptible to chlorine induced corrosion in repeated evaluations. This invention has also changed the capture pad metallurgy, i.e., that once the I/O pad were removed as the weak link, the current capture pads also emerged as having corrosion related problems.

The change to a molybdenum based system for both the I/O and capture pads has given a metallurgy that is corrosion resistant with no degradation in pull strengths.

This invention is applicable in arts such as processing where it can be employed in manufacturing semiconductor products for personal computers, minicomputers, large scale computers and other data processing equipment. In particular, this process is applicable to the manufacture of VLSI chips for industrial and consumer electronic devices. Electronic products such as transportation and control systems incorporating processing systems for continuous monitoring and like functions can use products made by use of this invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A multilayered interconnecting metallurgical structure to prevent diffusion between at least one non-noble metal layer and at least one noble or relatively less noble metal layer for an electronic component comprising, a structure over a substrate, wherein said structure comprises sequentially formed layers of at least one electrically conductive metal adhesion layer, at least one non-noble metal layer, a titanium layer, a molybdenum layer and at least one noble or relatively less noble metal layer and wherein at least a portion of said at least one electrically conductive metal adhesion layer is in direct electrical contact with at least one via in said substrate and wherein the combination of said titanium layer and said molybdenum layer prevents diffusion between said at least one non-noble metal layer and said at least one noble or relatively less noble metal layer.

2. The structure of claim 1, wherein said non-noble metal layer is on a base metallurgy and wherein said base metallurgy is selected from the group consisting of aluminum, chromium, cobalt, copper, hafnium, molybdenum nickel, niobium, tantalum, titanium, zirconium, noble metals and mixtures thereof.

3. The structure of claim 1, wherein said non-noble metal layer is selected from the group consisting of aluminum, cobalt, copper, nickel and mixtures thereof.

4. The structure of claim 1, wherein said noble or relatively less noble metal layer is selected from the group consisting of gold, platinum, palladium, rhodium, silver, tin and mixtures thereof.

5. The structure of claim 1, wherein said substrate is a semiconductor chip.

6. The structure of claim 1, wherein said substrate is selected from a group consisting of ceramic substrates, silicon substrates, glass-ceramic substrates, alumina substrates, aluminum nitride substrates, silicon nitride substrates or mullite substrates.

7. The structure of claim 1, wherein at least a portion of said noble or relatively less noble metal layer is in contact with a solder material.

8. The structure of claim 7, wherein a pin is secured to said solder material.

9. The structure of claim 7, wherein a solder ball is secured to said solder material.

10. The structure of claim 1, wherein at least a portion of a wire is secured to at least a portion of said noble or relatively less noble metal.

11. The structure of claim 1, wherein at least a portion of a connector is in contact with at least a portion of said structure.

12. The structure of claim 1, wherein said electrically conductive metal adhesion layer has a thickness from about 0.02 to about 0.10 micron, and preferably between about 0.02 to about 0.03 micron, said non-noble metal layer has a thickness from about 1.00 to about 8.00 micron, and preferably between about 2.00 to about 6.00 micron, said titanium layer has a thickness from about 0.20 to about 2.00 micron, and preferably between about 0.50 to about 1.50 micron, said molybdenum layer has a thickness from about 0.20 to about 2.00 micron, and preferably between about 0.50 to about 1.50 micron, and said noble or relatively less noble metal layer has a thickness from about 0.5 to about 5.00 micron, and preferably between about 1.00 to about 5.00 micron.

13. The structure of claim 1, wherein said electrically conductive metal adhesion layer has a thickness from about 0.02 to about 0.10 micron, and preferably between about 0.02 to about 0.03 micron.

14. The structure of claim 1, wherein said non-noble metal layer has a thickness from about 1.00 to about 8.00 micron, and preferably between about 2.00 to about 6.00 micron.

15. The structure of claim 1, wherein said electrically conductive metal adhesion layer is selected from a group consisting of chromium, tantalum, titanium, tungsten, hafnium, molybdenum, vanadium, zirconium and mixtures thereof.

16. The structure of claim 1, wherein said titanium layer has a thickness from about 0.02 to about 2.00 micron, and preferably between about 0.50 to about 1.50 micron.

17. The structure of claim 1, wherein said molybdenum layer has a thickness from about 0.02 to about 2.00 micron, and preferably between about 0.50 to about 1.50 micron.

18. The structure of claim 1, wherein said noble or relatively less noble metal layer has a thickness from about 0.5 to about 5.00 micron and preferably between about 1.00 to about 5.00 micron.

19. The structure of claim 1, wherein said titanium layer has a thickness from about 0.02 to about 2.00 micron, and preferably between about 0.50 to about 1.50 micron, and wherein said molybdenum layer has a thickness from about 0.20 to about 2.00 micron, and preferably between about 0.50 to about 1.50 micron.

* * * * *